United States Patent
Nishi et al.

(10) Patent No.: US 9,210,991 B2
(45) Date of Patent: Dec. 15, 2015

(54) APPARATUS AND METHOD FOR KEEPING MOBILE DEVICES WARM IN COLD CLIMATES

(71) Applicant: Intel Corporation, Santa Clara, CA (US)

(72) Inventors: Yoshifumi Nishi, Ushiku (JP); Douglas Heymann, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 27 days.

(21) Appl. No.: 14/193,507

(22) Filed: Feb. 28, 2014

(65) Prior Publication Data

US 2015/0245699 A1 Sep. 3, 2015

(51) Int. Cl.
*A45F 5/00* (2006.01)
*F28D 20/02* (2006.01)
*H05K 7/20* (2006.01)

(52) U.S. Cl.
CPC . *A45F 5/00* (2013.01); *F28D 20/02* (2013.01); *A45F 2005/002* (2013.01); *A45F 2200/0516* (2013.01); *H05K 7/20* (2013.01); *H05K 7/2039* (2013.01)

(58) Field of Classification Search
CPC ............... A45F 5/00; A45F 2005/002; A45F 2200/0516; H05K 7/2039; H05K 7/20; F28D 20/02
See application file for complete search history.

(56) References Cited

U.S. PATENT DOCUMENTS

| | | | |
|---|---|---|---|
| 7,486,517 B2* | 2/2009 | Aapro et al. | 361/714 |
| 7,595,468 B2* | 9/2009 | Moon et al. | 219/540 |
| 7,965,514 B2* | 6/2011 | Hill et al. | 361/707 |
| 8,087,254 B2 | 1/2012 | Arnold | |
| 8,477,499 B2* | 7/2013 | Hill et al. | 361/707 |
| 8,658,943 B1 | 2/2014 | Larsen et al. | |
| 8,937,384 B2* | 1/2015 | Bao et al. | 257/714 |
| 9,012,811 B2* | 4/2015 | White | 219/209 |
| 2006/0044763 A1* | 3/2006 | Hornung et al. | 361/707 |
| 2006/0191049 A1* | 8/2006 | Elkins et al. | 2/7 |
| 2007/0127210 A1 | 6/2007 | Mahalingam et al. | |
| 2010/0009174 A1* | 1/2010 | Reis | 428/332 |
| 2010/0282730 A1* | 11/2010 | Marcus et al. | 219/209 |
| 2012/0133885 A1 | 5/2012 | Howell et al. | |
| 2014/0242127 A1* | 8/2014 | Yokozeki et al. | 424/401 |
| 2014/0299169 A1* | 10/2014 | Schneider et al. | 136/201 |

FOREIGN PATENT DOCUMENTS

KR 10-2014-0017734 A 2/2014

OTHER PUBLICATIONS

International Search Report and Written Opinion received for PCT Patent Application No. PCT/US2015/017748, mailed on May 19, 2015, 13 Pages.

* cited by examiner

*Primary Examiner* — Justin Larson
(74) *Attorney, Agent, or Firm* — Inventive Patent Law, P.C.; Jim H. Salter

(57) ABSTRACT

An apparatus and method for keeping mobile devices warm in cold climates are disclosed. A particular embodiment includes: a frame structure wherein a first portion of the frame structure being in proximity to the body of a user to receive body heat from the user, the frame structure including a second portion to support electronic components of the apparatus; and a thermal conduit thermally coupled between the first and second portions of the frame structure, the thermal conduit transferring body heat received at the first portion to the electronic components of the apparatus at the second portion.

17 Claims, 6 Drawing Sheets

A Method for Keeping Mobile Devices Warm in Cold Climates
-600-

Expose a first portion of a mobile device frame structure to the body of a user to receive body heat from the user.
-610-

Thermally couple a thermal conduit between the first portion and a second portion of the frame structure, the second portion of the frame structure supporting electronic components of the mobile device.
-620-

Cause the thermal conduit to transfer body heat received at the first portion to the electronic components at the second portion of the mobile device.
-630-

End

Figure 6

APPARATUS AND METHOD FOR KEEPING MOBILE DEVICES WARM IN COLD CLIMATES

TECHNICAL FIELD

This patent application relates to electronic systems, wearable devices, peripheral devices, and mobile devices, according to various example embodiments, and more specifically to an apparatus and method for keeping mobile devices warm in cold climates.

BACKGROUND

Computing devices, communication devices, imaging devices, electronic devices, accessories, or other types of peripheral devices designed to be worn or attached to a user (denoted as wearables or wearable devices) are becoming very popular. Wearables can be considered to be a form of mobile device. Mobile phones with headsets or earbud accessories and the Google© Glass wearable computer are examples of such wearables or mobile devices. Because wearable devices are typically worn by or attached to the user all or most of the time, it is important that wearables serve as a helpful tool aiding the user when needed in all environmental conditions, and not become an annoying distraction when the user is trying to focus on other things.

Handheld devices, wearable devices, and other mobile devices can be exposed to cold ambient temperatures as they are designed to be mobile. Interestingly, many of these devices today still have a minimum operating temperature limit of 5° C., carried over from typical consumer electronics. However in many parts of the world, the minimum ambient temperature outside is much lower than 5° C. Nevertheless, end users have been using, or attempting to use, these devices anyway in cold environments. In most cases, these devices are kept warm inside clothing and people have found that they can use them without any problems for a short time. However, some wearables, such as eyeglass-like wearable devices (e.g., Google© Glass), do not have the luxury of being pre-heated inside clothing, because these devices are worn all the time. As such, active heating of some wearables may be required in cold climates in order to maintain a sufficient working temperature for the devices.

BRIEF DESCRIPTION OF THE DRAWINGS

The various embodiments are illustrated by way of example, and not by way of limitation, in the figures of the accompanying drawings in which:

FIG. 6 is a flow chart illustrating an example embodiment of a method as described herein.

DETAILED DESCRIPTION

In the following description, for purposes of explanation, numerous specific details are set forth in order to provide a thorough understanding of the various embodiments. It will be evident, however, to one of ordinary skill in the art that the various embodiments may be practiced without these specific details.

In the various embodiments described herein, an apparatus and method for keeping mobile devices warm in cold climates are disclosed. The various embodiments described herein provide various ways to transmit body heat to electronic components to keep these components warm and operable in cold ambient temperatures.

Wearable devices, such as eyeglass-like wearable devices, are typically in contact with or in proximity to the user's body most or all of the time. In the various embodiments described herein, new structures use heat conducting material in combination with structural supports to transmit body heat to the device components to keep the devices warm and operable in cold ambient temperatures. This concept completely reverses the conventional purpose of thermal design used in existing computing or communication devices. In the various embodiments described herein, thermal components are used to transfer heat to the computing or communication device and thus heat up the device in cold ambient temperatures, instead of cooling the device down as typically done. It is anticipated that future handheld and wearable devices will use data processors that have much less heat dissipation capability because high temperature thermal management in these processors is less likely a problem. Thus, physical thermal design can start to focus on improving usability of the device in various environmental conditions, such as in typical winter or cold conditions.

Figure 1:
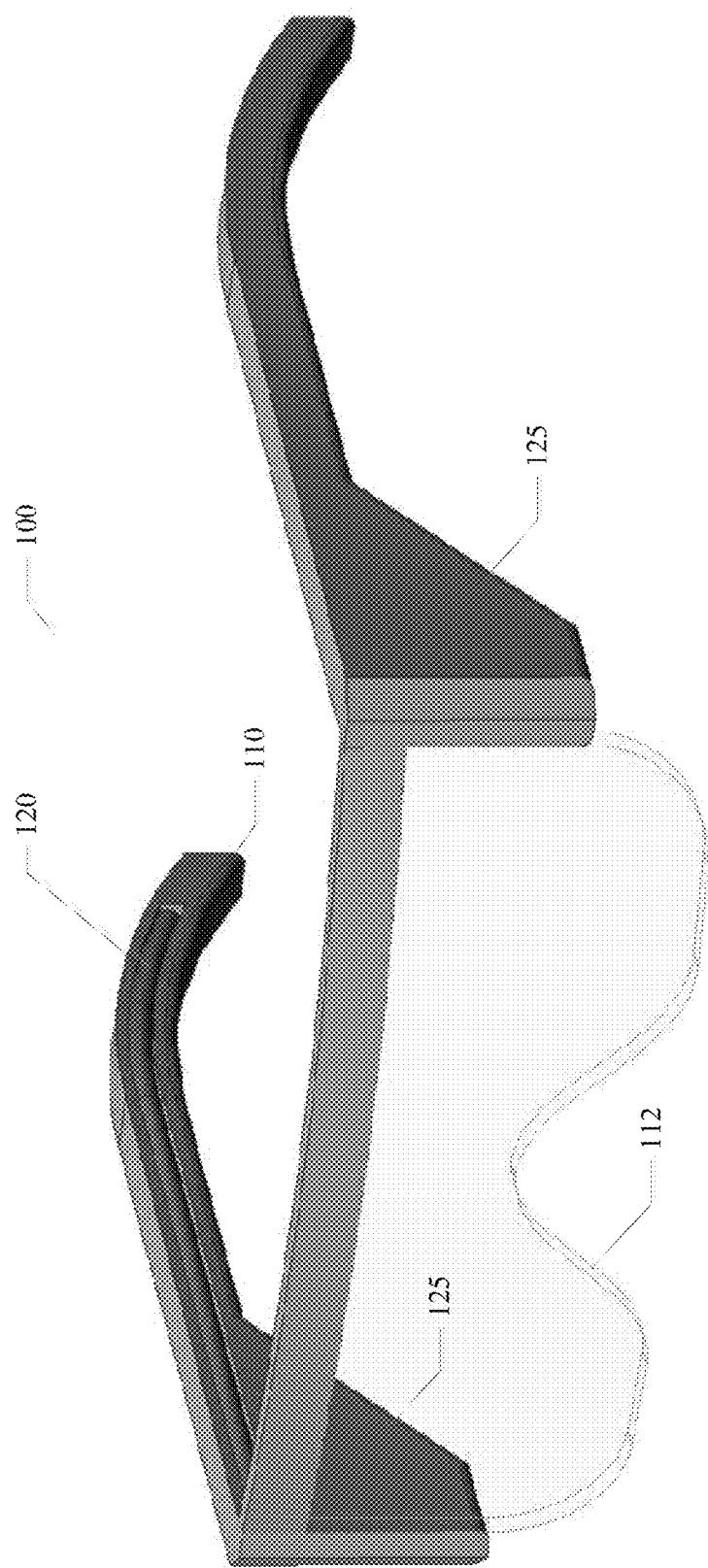
FIG. 1 illustrates an example embodiment of an apparatus and method for keeping mobile devices warm in cold climates, the example embodiment being configured for use as an eyeglass-like wearable device.

Referring now to FIG. 1, an example embodiment 100 of an apparatus and method for keeping mobile devices warm in cold climates as described herein is configured for use as an eyeglass-like wearable device. In the embodiment shown, the wearable device can include electronics embedded into the frame of the wearable device. For example, the wearable device 100 shown in FIG. 1 can include a frame structure or frame 110 to support lenses 112 for the eyes of a wearer. As apparent to those of ordinary skill in the art, a similar device construct is used in conventional eyeglasses or in some wearable devices, such as the Google© Glass. These conventional wearable devices can also include a portion of the frame or a frame housing 125 for retaining and protecting the electronic components of the wearable device. The electronics retained in the frame housing 125 can include a variety of computing or communication components including, data processors, memory, interfaces, power control circuitry, transceiver circuitry, and the like.

Handheld devices, wearable devices, and other mobile devices can be exposed to cold ambient temperatures as they are designed to be mobile. However, the electronic components of many of these devices can be susceptible to the negative effects of cold temperatures. In some cases, these negative effects of cold temperatures can cause user experience problems ranging from slow liquid crystal diode (LCD) refresh to device shutdown due to excessive battery voltage drop. As such, active heating of some wearables is necessary in cold climates in order to maintain a sufficient working temperature for the devices.

Many wearable devices, such as the eyeglass-like device 100 shown in FIG. 1, are almost always in contact with or in proximity to some portion of the body of the user/wearer. For example, the eyeglass-like device 100 includes structural elements or frame structure or frame 110 designed to fit around the wearer's head and to rest on the ears and bridge of the nose of a wearer. As such, some portion of the device 100 structure is in direct contact with some portion of the body of the wearer. As a result, a portion of the device 100 structure is exposed to the warming effects of the direct contact with the portion of the body of the wearer. As disclosed herein, this warming effect of the direct contact with the wearer's body is used to warm the electrical circuitry of the wearable device to enable the device to function in colder ambient temperatures. Particular embodiments are described in more detail below.

Referring again to FIG. 1, an example embodiment augments the structures and materials of the wearable device 100 to include heat conducting materials and structures as support elements to both support the wearable device and to transmit body heat from the wearer to the electronic components of the wearable devices to keep the electronic components warm in cold ambient temperatures. This concept completely reverses the conventional purpose of thermal design used in existing computing or communication devices. In the various embodiments described herein, thermal components are used to transfer heat to the computing or communication device and thus heat up the device in cold ambient temperatures, instead of cooling the device down as typically done. It is anticipated that future handheld and wearable devices will use data processors that have much less heat dissipation capability, because high temperature thermal management in these processors is less likely a problem. Thus, physical thermal design can start to focus on improving usability of the device in various environmental conditions, such as in typical winter or cold conditions.

Referring again to FIG. 1, an example embodiment augments the structures and materials of the wearable device 100 to include heat conducting materials and structures, such as thermal conduit 120. In the example embodiment of FIG. 1, the thermal conduit 120, such as a heat pipe and/or a graphite conductor, is attached to or integrated into the frame structure or frame 110 so that the thermal conduit 120, or a portion thereof, may come into contact with a portion of the wearer's body while the wearable device is in use. However, note that the heat conducting components do not need to be exposed to or come into direct contact with the user in order to be effective. Alternatively, a portion of the structure of the wearable device, such as the frame structure or frame 110, can come into contact with a portion of the wearer's body while the wearable device 100 is in use. As a result, the thermal conduit 120 and/or the portion of the wearable device 100 in contact with or in proximity to the wearer's body heats up. The wearer's body heat can actively warm a portion of the wearable device 100 and the thermal conduit 120. The thermal conduit 120 is designed to transfer the heat collected at one portion of the structure of the wearable device 100 to other portions of the wearable device 100. The heat is transferred by the natural process of heat conduction that occurs throughout the length of the thermal conduit 120. In this manner, heat can be transferred from one portion of the wearable device 100 to other portions of the wearable device 100. Over time, the heat extracted from the wearer's body is transferred throughout the structure of the wearable device 100. This heat can also be transferred to the electronic components of the wearable device 100 retained in frame housing 125. As a result, the electronic components of the wearable device are warmed and are thus enabled to operate in colder than normal ambient temperatures.

Referring again to FIG. 1, the example embodiment 100 shows a thermal conduit 120 embedded inside the frame 110 of the wearable device 100. In alternative embodiments, this thermal conduit 120 can be replaced by other heat conducting materials. Alternatively, the frame structure or frame 110 itself can be made of a high thermal conductivity material.

Figure 2:
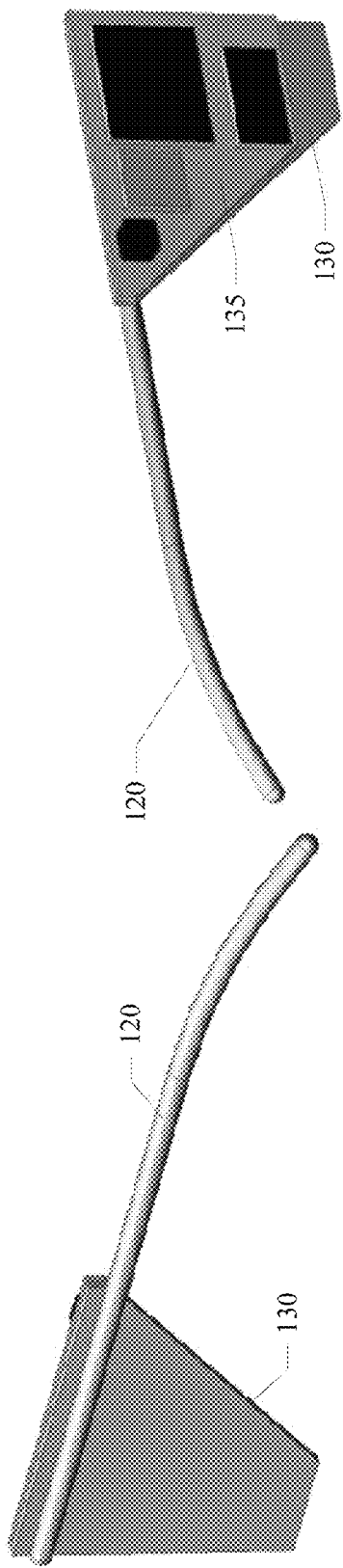
FIG. 2 illustrates an example embodiment of an apparatus and method for keeping mobile devices warm in cold climates, the example embodiment being configured for use as an eyeglass-like wearable device and augmented with heat spreaders.

Referring now to FIG. 2, the frame structure or frame 110 can be further augmented with heat spreaders 130, which are thermally coupled with the thermal conduit 120 as shown. The heat spreaders 130 are fabricated from a thermally conductive material and configured to transfer heat to large areas of the electronic components 135 of the wearable device 100. The heat spreaders 130 allow the heat conducted through thermal conduit 120 to be dispersed among all of the electronic elements 135 of the wearable device 100 that may be sensitive to cold temperatures. As a result, heat captured at a particular portion of the frame 110 of the wearable device 100 can be transferred and uniformly dispersed among the electronic components of the wearable device 100.

In a particular embodiment, for user comfort, the thermal conductivity of the thermal conduit 120, the heat spreaders 130, and/or the device frame 110 itself can be configured to intentionally increase thermal resistance in the heat path just enough to keep the electronic components of the wearable device 100 at their minimum working temperature or higher. In this manner, the structure of the wearable device will not conduct as much heat from the user and will not feel too cold to the user.

In other embodiments of the disclosed subject matter, various types of wearable devices or other mobile devices can similarly be augmented to enable the transfer of heat from the body of a wearer to the temperature-sensitive electronic components of the wearable device. For example, handheld mobile phones, headsets, earbud accessories, and devices configured to be worn on a user's arm, leg, head, or chest can be configured as described herein to include a portion in contact with or in proximity to the body of a wearer, a thermal conduit element, and a heat spreader element to transfer and disperse heat from the body of a wearer to the temperature-sensitive electronic components of the wearable device.

Figure 3:
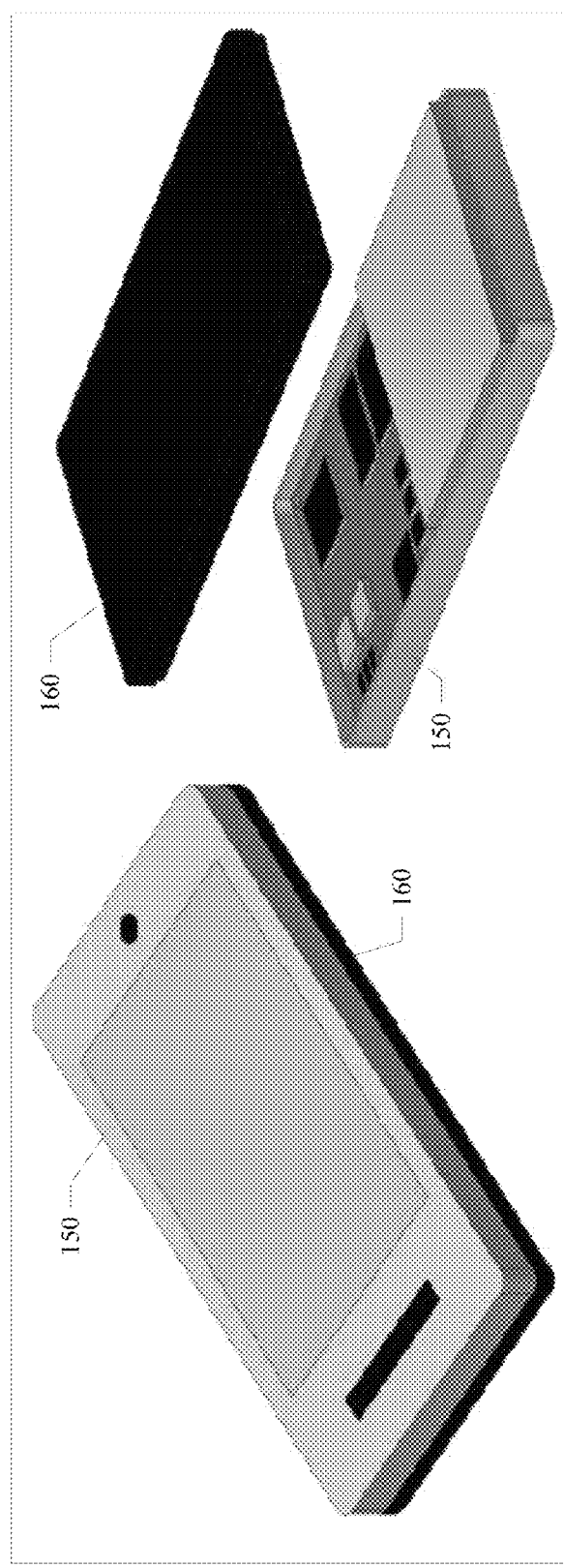
FIG. 3 illustrates an example embodiment showing the use of a thermally-retentive material to modify the thermal characteristics of an outer casing of a mobile device.

Referring now to FIG. 3, an example embodiment illustrates the use of a thermally-retentive material to modify the thermal characteristics of an outer casing of a mobile device 150. As shown in FIG. 3, a thermally-retentive material 160 can be removably applied to a surface of a mobile device 150. In other embodiments, the thermally-retentive material 160 can be integrated into the inside of the casing of mobile device 150. Alternatively, the thermally-retentive material 160 can replace the casing of mobile device 150 or the casing of mobile device 150 can be fabricated from a thermally-retentive material. The thermally-retentive material 160 can be fabricated from or using any of a variety of latent heat storage, phase change materials, such as wax, paraffin, alkanes, or other heat retentive materials, that tend to readily absorb and retain heat when a heat source is present and slowly dissipate heat when the heat source is not present. In a particular embodiment, a low end phase change temperature for an energy storage wax is 28° C. It will be apparent to those of ordinary skill in the art that other similar materials may equivalently be used as taught herein.

In the example embodiment shown in FIG. 3, the thermally-retentive material 160 can be configured as a component applied to or integrated with a surface of a mobile device 150 or applied to a frame structure of a mobile device using well-known over-molding techniques to removably bind the thermally-retentive material 160 to a surface of the mobile device assembly. Given that a user typically holds the mobile device 150 in the palm of a hand, the body heat of the user can be transferred from the user's hand to a surface or other portion of the thermally-retentive material 160. Alternatively, the user can store the mobile device 150 in a pocket or other location that is warmer than the ambient temperature. The warmer temperatures in the pocket or other warm location can cause the transfer of heat to the surface or other portion of the thermally-retentive material 160. Over time, the temperature of the thermally-retentive material 160 increases. Because of the thermal characteristics of the thermally-retentive material 160, the thermally-retentive material 160 retains the heat absorbed from the user's hand (or other body part) or warm location for a period of time, even when the user's body is not in contact with or in proximity to the thermally-retentive material 160 or the mobile device 150 is removed from the warm location. Given the attachment or integration of the thermally-retentive material 160 with a surface of the mobile device 150, the heat absorbed by the thermally-retentive material 160 can be transferred to the temperature sensitive electronic components of the mobile device 150 by thermal conduction. In a particular embodiment, the mobile device 150 can be augmented with the thermal conduit element and heat spreader element, as described above, to improve the transfer of heat from the thermally-retentive material 160 to the electronic components of the mobile device 150. As a result, the thermal storage and transfer properties of the thermally-retentive material 160 enables the heat from the body of a user or a warm location to keep the electronic components of a mobile device or wearable device warmer for a longer period of time. Once the stored thermal energy is depleted, the thermally-retentive material 160 starts to cool down. However, because the specific heat of the thermally-retentive material 160 is larger/higher than typical mobile device outer casing materials, like polycarbonate, the rate of thermal dissipation is lower for the thermally-retentive material 160. In a particular embodiment, the heat storage and transfer techniques described herein can increase the usable time of a mobile or wearable device in cold climates by several minutes or tens of minutes. In various embodiments, the phase change material can be modified or the size of the thermally-retentive material 160 can be altered to achieve desired heat flux characteristics. As a result, the example embodiments enable the use of body heat to improve the operation of mobile or wearable devices in cold temperatures.

Figure 4:
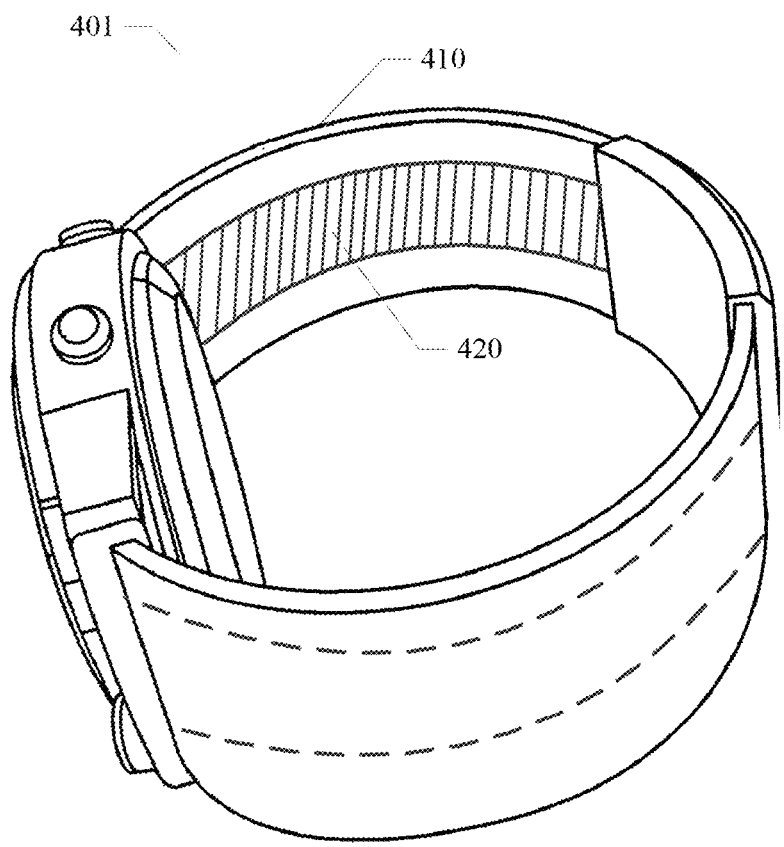
FIGS. 4 and 5 illustrate other example embodiments of an apparatus and method for keeping mobile devices warm in cold climates, the example embodiments being configured for use with other form factors augmented with heat spreaders.
Figure 5:
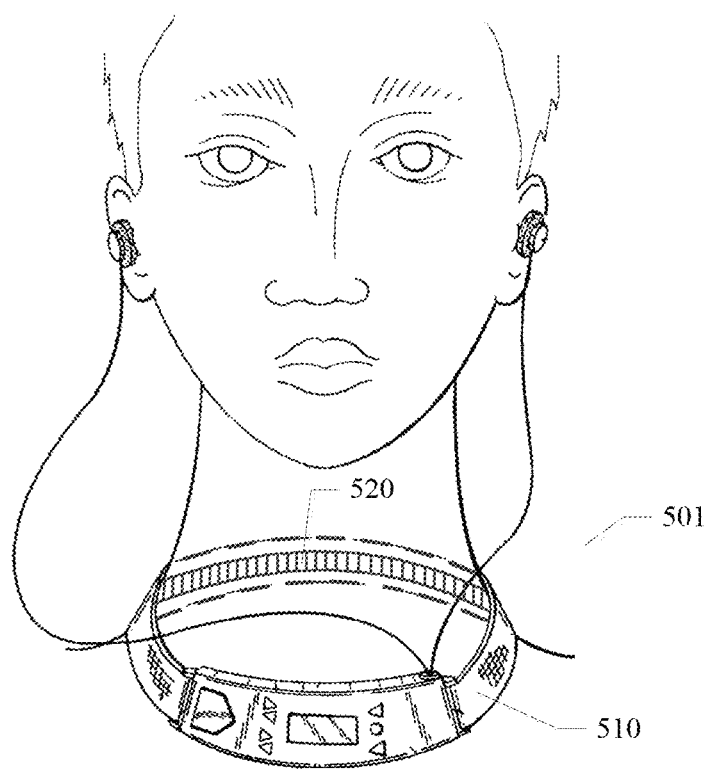

FIGS. 4 and 5 illustrate other example embodiments of an apparatus and method for keeping mobile devices warm in cold climates, the example embodiments being configured for use with other form factors augmented with heat spreaders. Referring to FIG. 4, a wrist-worn form factor comprising a wearable device 401 is shown. The example wearable device 401 shown in FIG. 4 can include a frame structure or frame 410 to support the components of the wearable device 401. The wearable device 401 of the example embodiment is augmented to modify the structures and materials of the wearable device 401 to include heat conducting materials and structures, such as thermal conduit 420. In the example embodiment of FIG. 4, the thermal conduit 420, such as a heat pipe and/or a graphite conductor, is attached to or integrated into the frame structure or frame 410 so that the thermal conduit 420, or a portion thereof, may come into contact with a portion of the wearer's body (e.g., the wearer's wrist) while the wearable device 401 is in use. A similar embodiment can be implemented as a finger ring form factor augmented to include a thermal conduit that may come into contact with a finger of the wearer while the wearable device is in use.

Referring to FIG. 5, a neck-worn form factor comprising a wearable device 501 is shown. The example wearable device 501 shown in FIG. 5 can include a frame structure or frame 510 to support the components of the wearable device 501. The wearable device 501 of the example embodiment is augmented to modify the structures and materials of the wearable device 501 to include heat conducting materials and structures, such as thermal conduit 520. In the example embodiment of FIG. 5, the thermal conduit 520, such as a heat pipe and/or a graphite conductor, is attached to or integrated into the frame structure or frame 510 so that the thermal conduit 520, or a portion thereof, may come into contact with a portion of the wearer's body (e.g., the wearer's neck or torso) while the wearable device 501 is in use.

Additionally, at low temperatures, condensation inside electronic devices can pose various risks. The various techniques described herein not only provide thermal management for mobile or wearable devices, but the disclosed embodiments also provide protection against such condensation.

Referring now to FIG. 6, a flow diagram illustrates an example embodiment of a method for keeping mobile devices warm in cold climates as described herein. The method 600 of an example embodiment includes: exposing a first portion of a mobile device frame structure to the body of a user to receive body heat from the user (processing block 610); thermally coupling a thermal conduit between the first portion and a second portion of the frame structure, the second portion of the frame structure supporting electronic components of the mobile device (processing block 620); and causing the thermal conduit to transfer body heat received at the first portion to the electronic components at the second portion of the mobile device (processing block 630).

In various embodiments as described herein, example embodiments include at least the following examples.

An apparatus comprising:
 a frame structure wherein a first portion of the frame structure being in proximity to the body of a user to receive body heat from the user, the frame structure including a second portion to support electronic components of the apparatus; and
 a thermal conduit thermally coupled between the first and second portions of the frame structure, the thermal conduit transferring body heat received at the first portion to the electronic components of the apparatus at the second portion.

The apparatus as claimed above further including a heat spreader in thermal contact with the thermal conduit and the second portion of the frame structure to spread the body heat among the electronic components of the apparatus.

The apparatus as claimed above wherein the thermal conduit is embedded into the frame structure.

The apparatus as claimed above wherein the thermal conductivity of the thermal conduit is configured to keep the electronic components of the apparatus at their minimum working temperature or higher.

The apparatus as claimed above wherein the apparatus is a mobile device or a wearable device.

The apparatus as claimed above wherein the apparatus is from a group consisting of: a handheld mobile phone, a headset, an earbud accessory, and a device configured to be worn on a user's arm, leg, head, or chest.

The apparatus as claimed above including a thermally-retentive material applied to the frame structure to absorb and retain the body heat.

The apparatus as claimed above wherein the thermally-retentive material is a latent heat storage, phase change material.

A mobile device comprising:
a frame structure wherein a first portion of the frame structure being in proximity to the body of a user to receive body heat from the user;
electronic components supported by a second portion of the frame structure; and
a thermal conduit thermally coupled between the first and second portions of the frame structure, the thermal conduit transferring body heat received at the first portion to the electronic components at the second portion.

The mobile device as claimed above further including a heat spreader in thermal contact with the thermal conduit and the second portion of the frame structure to spread the body heat among the electronic components.

The mobile device as claimed above wherein the thermal conduit is embedded into the frame structure.

The mobile device as claimed above wherein the thermal conductivity of the thermal conduit is configured to keep the electronic components at their minimum working temperature or higher.

The mobile device as claimed above wherein the mobile device is a wearable device.

The mobile device as claimed above wherein the mobile device is from a group consisting of: a handheld mobile phone, a headset, an earbud accessory, and a device configured to be worn on a user's arm, leg, head, or chest.

The mobile device as claimed above including a thermally-retentive material applied to the frame structure to absorb and retain the body heat.

The mobile device as claimed above wherein the thermally-retentive material is a latent heat storage, phase change material.

A method comprising:
exposing a first portion of a mobile device frame structure to the body of a user to receive body heat from the user;
thermally coupling a thermal conduit between the first portion and a second portion of the frame structure, the second portion of the frame structure supporting electronic components of the mobile device; and
causing the thermal conduit to transfer body heat received at the first portion to the electronic components at the second portion of the mobile device.

The method as claimed above further including providing a heat spreader in thermal contact with the thermal conduit and the second portion of the frame structure to spread the body heat among the electronic components of the mobile device.

The method as claimed above wherein the mobile device is from a group consisting of: a handheld mobile phone, a headset, an earbud accessory, and a device configured to be worn on a user's arm, leg, head, or chest.

The method as claimed above including applying a thermally-retentive material to the frame structure to absorb and retain the body heat.

An apparatus comprising:
a frame means wherein a first portion of the frame means being in proximity to the body of a user to receive body heat from the user, the frame means including a second portion to support electronic components of the apparatus; and
a thermal conduction means coupled between the first and second portions of the frame means, the thermal conduction means transferring body heat received at the first portion to the electronic components of the apparatus at the second portion.

The apparatus as claimed above further including a heat spreading means in thermal contact with the thermal conduction means and the second portion of the frame means to spread the body heat among the electronic components of the apparatus.

The apparatus as claimed above wherein the thermal conduction means is embedded into the frame means.

The apparatus as claimed above wherein the thermal conductivity of the thermal conduction means is configured to keep the electronic components of the apparatus at their minimum working temperature or higher.

The apparatus as claimed above wherein the apparatus is a mobile device or a wearable device.

The apparatus as claimed above wherein the apparatus is from a group consisting of: a handheld mobile phone, a headset, an earbud accessory, and a device configured to be worn on a user's arm, leg, head, or chest.

The apparatus as claimed above including a thermal retention means applied to the frame means to absorb and retain the body heat.

The apparatus as claimed above wherein the thermal retention means is a latent heat storage, phase change material.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
a frame structure wherein a first portion of the frame structure being in proximity to the body of a user to receive body heat from the user, the frame structure including a second portion to support electronic components of the apparatus;
a thermal conduit thermally coupled between the first and second portions of the frame structure, the thermal conduit transferring body heat received at the first portion to the electronic components of the apparatus at the second portion; and a heat spreader in thermal contact with the thermal conduit and the second portion of the frame structure to spread the body heat among the electronic components of the apparatus.

2. The apparatus as claimed in claim 1 wherein the thermal conduit is embedded into the frame structure.

3. The apparatus as claimed in claim 1 wherein the thermal conductivity of the thermal conduit is configured to keep the electronic components of the apparatus at their minimum working temperature or higher.

4. The apparatus as claimed in claim 1 wherein the apparatus is a mobile device or a wearable device.

5. The apparatus as claimed in claim 1 wherein the apparatus is from a group consisting of: a handheld mobile phone, a headset, an earbud accessory, and a device configured to be worn on a user's arm, leg, head, or chest.

6. The apparatus as claimed in claim 1 including a thermally-retentive material applied to the frame structure to absorb and retain the body heat.

7. The apparatus as claimed in claim 1 wherein the thermally-retentive material is a latent heat storage, phase change material.

8. A mobile device comprising:
- a frame structure wherein a first portion of the frame structure being in proximity to the body of a user to receive body heat from the user;
- electronic components supported by a second portion of the frame structure;
- a thermal conduit thermally coupled between the first and second portions of the frame structure, the thermal conduit transferring body heat received at the first portion to the electronic components at the second portion; and a heat spreader in thermal contact with the thermal conduit and the second portion of the frame structure to spread the body heat among the electronic components.

9. The mobile device as claimed in claim 8 wherein the thermal conduit is embedded into the frame structure.

10. The mobile device as claimed in claim 8 wherein the thermal conductivity of the thermal conduit is configured to keep the electronic components at their minimum working temperature or higher.

11. The mobile device as claimed in claim 8 wherein the mobile device is a wearable device.

12. The mobile device as claimed in claim 8 wherein the mobile device is from a group consisting of: a handheld mobile phone, a headset, an earbud accessory, and a device configured to be worn on a user's arm, leg, head, or chest.

13. The mobile device as claimed in claim 8 including a thermally-retentive material applied to the frame structure to absorb and retain the body heat.

14. The mobile device as claimed in claim 8 wherein the thermally-retentive material is a latent heat storage, phase change material.

15. A method comprising:
- exposing a first portion of a mobile device frame structure to the body of a user to receive body heat from the user;
- thermally coupling a thermal conduit between the first portion and a second portion of the frame structure, the second portion of the frame structure supporting electronic components of the mobile device;
- causing the thermal conduit to transfer body heat received at the first portion to the electronic components at the second portion of the mobile device; and providing a heat spreader in thermal contact with the thermal conduit and the second portion of the frame structure to spread the body heat among the electronic components of the mobile device.

16. The method as claimed in claim 15 wherein the mobile device is from a group consisting of: a handheld mobile phone, a headset, an earbud accessory, and a device configured to be worn on a user's arm, leg, head, or chest.

17. The method as claimed in claim 15 including applying a thermally-retentive material to the frame structure to absorb and retain the body heat.

\* \* \* \* \*